United States Patent
Wang et al.

(10) Patent No.: US 10,348,264 B2
(45) Date of Patent: Jul. 9, 2019

(54) METHOD AND APPARATUS FOR AUDIO MIXING

(71) Applicant: TENCENT TECHNOLOGY (SHENZHEN) COMPANY LIMITED, Shenzhen (CN)

(72) Inventors: Xinliang Wang, Shenzhen (CN); Bin Li, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 0 days.

(21) Appl. No.: 16/027,745

(22) Filed: Jul. 5, 2018

(65) Prior Publication Data

US 2018/0316328 A1 Nov. 1, 2018

Related U.S. Application Data

(63) Continuation of application No. PCT/CN2017/071479, filed on Jan. 18, 2017.

(30) Foreign Application Priority Data

Jan. 28, 2016 (CN) .......................... 2016 1 0058634

(51) Int. Cl.
  H04R 3/12 (2006.01)
  H03G 3/32 (2006.01)
  (Continued)

(52) U.S. Cl.
  CPC .............. *H03G 3/32* (2013.01); *G10L 25/03* (2013.01); *H03G 3/3005* (2013.01);
  (Continued)

(58) Field of Classification Search
  CPC ....... G10L 19/00; G10L 19/008; G10L 25/03; H03G 3/32; H04R 3/12
  (Continued)

(56) References Cited

U.S. PATENT DOCUMENTS

2011/0246191 A1 * 10/2011 Lv ........................ G10L 19/00
  704/226
2013/0195276 A1 8/2013 Ojala
2015/0030149 A1 1/2015 Chu et al.

FOREIGN PATENT DOCUMENTS

CN 1805006 A 7/2006
CN 103259943 A 8/2013
  (Continued)

OTHER PUBLICATIONS

Search Report in International Application No. PCT/CN2017/071479 dated Mar. 31, 2017, 4 pages.
  (Continued)

*Primary Examiner* — Melur Ramakrishnaiah
(74) *Attorney, Agent, or Firm* — Marshall, Gerstein & Borun LLP

(57) ABSTRACT

The embodiments of the present disclosure provide a method for audio mixing. At least two audio input signals are obtained. Then the at least two audio input signals are linearly superimposed. A mixed signal obtained by linearly superimposing the at least two audio input signals is divided into at least two audio mixing signal-intensity zones according to an audio intensity of the mixed signal. Audio intensity scalability is performed for respective audio mixing signal-intensity zones using corresponding scalability ratios. The at least two audio mixing signal-intensity zones after performing the audio intensity scalability is superimposed and output. The embodiments of the present disclosure further provide an apparatus for audio mixing.

16 Claims, 3 Drawing Sheets

(51) Int. Cl.
  *G10L 25/03* (2013.01)
  *H04H 60/04* (2008.01)
  *H04M 3/56* (2006.01)
  *H03G 3/30* (2006.01)

(52) U.S. Cl.
  CPC ............ *H04H 60/04* (2013.01); *H04M 3/568* (2013.01); *H04R 3/12* (2013.01)

(58) Field of Classification Search
  USPC .............................................. 381/57, 70, 74
  See application file for complete search history.

(56) References Cited

FOREIGN PATENT DOCUMENTS

| | | | |
|---|---|---|---|
| CN | 104539816 A | | 4/2015 |
| CN | 104822108 A | * | 8/2015 |
| CN | 105280191 A | | 1/2016 |
| CN | 105282478 A | | 1/2016 |
| CN | 105719653 A | | 6/2016 |

OTHER PUBLICATIONS

Office Action in CN Application No. 201610058634.1 dated Feb. 26, 2019, 10 pages.
Wen-lin et al., "A Novel Fast Real-Time Audio Mixing Algorithm in Multimedia Conference", Journal of Electronics & Information Technology, vol. 29, No. 3, Mar. 2007, 6 pages.

\* cited by examiner

METHOD AND APPARATUS FOR AUDIO MIXING

RELATED APPLICATIONS

This application is a continuation application of PCT Patent Application No. PCT/CN2017/071479, filed on Jan. 18, 2017, which claims priority to Chinese Patent Application No. 201610058634.1, entitled "A Method and Apparatus for Audio Mixing" filed on Jan. 28, 2016, all of which are herein incorporated by reference in their entireties.

TECHNICAL FIELD

The present disclosure relates to internet technologies and in particular to a method and apparatus for audio mixing.

BACKGROUND OF THE DISCLOSURE

At present, with the development of multimedia communications, the multimedia conference has become a key technology of development, and audio interaction processing is the most essential and critical for the multimedia conference technology, and has a strict real-time requirement. Therefore, in practice, for multiple terminal devices used at different places, if they are used to perform real-time audio interaction at the multiple places, multiple audios need to be mixed and then output, which is referred to as audio mixing.

SUMMARY

In view of the foregoing, the embodiments of the present disclosure provide a method and apparatus for audio mixing, to efficiently avoid the overflow distortion and solve the problem that voices sometimes are loud and sometimes are low.

The embodiments of the present disclosure provide a method for audio mixing, including:
 obtaining at least two audio input signals;
 linearly superimposing the at least two audio input signals;
 dividing a mixed signal, obtained by linearly superimposing the at least two audio input signals, into at least two audio mixing signal-intensity zones, according to an audio intensity of the mixed signal;
 performing audio intensity scalability for respective audio mixing signal-intensity zones using corresponding scalability ratios, in which a scalability ratio used by an audio mixing signal-intensity zone having a higher audio intensity is smaller than a scalability ratio used by an audio mixing signal-intensity zone having a lower audio intensity; and
 superimposing the at least two audio mixing signal-intensity zones after performing the audio intensity scalability, and outputting the superimposed at least two audio mixing signal-intensity zones.

Accordingly, the embodiments of the present disclosure further provide an apparatus for audio mixing, including: a processor and a memory, in which the memory stores instruction modules executable by the processor, and the instruction modules include:
 an audio input module to obtain at least two audio input signals;
 an audio mixing superimposition module to linearly superimpose the at least two audio input signals;
 an intensity zone dividing module to divide a mixed signal, obtained by linearly superimposing the at least two audio input signals, into at least two audio mixing signal-intensity zones, according to an audio intensity of the mixed signal;
 an audio scalability module to perform audio intensity scalability for respective audio mixing signal-intensity zones using corresponding scalability ratios, in which a scalability ratio used by an audio mixing signal-intensity zone having a higher audio intensity is smaller than a scalability ratio used by an audio mixing signal-intensity zone having a lower audio intensity; and
 an audio mixing output module to superimpose the at least two audio mixing signal-intensity zones after performing the audio intensity scalability, and output the superimposed at least two audio mixing signal-intensity zones.

A non-transitory storage medium, storing computer instructions, wherein the computer instructions are executable by the processor to perform:
 obtaining at least two audio input signals;
 linearly superimposing the at least two audio input signals;
 dividing a mixed signal, obtained by linearly superimposing the at least two audio input signals, into at least two audio mixing signal-intensity zones, according to an audio intensity of the mixed signal;
 performing audio intensity scalability for respective audio mixing signal-intensity zones using corresponding scalability ratios, in which a scalability ratio used by an audio mixing signal-intensity zone having a higher audio intensity is smaller than a scalability ratio used by an audio mixing signal-intensity zone having a lower audio intensity; and
 superimposing the at least two audio mixing signal-intensity zones after performing the audio intensity scalability, and outputting the superimposed at least two audio mixing signal-intensity zones.

BRIEF DESCRIPTION OF THE DRAWINGS

To describe the technical solutions in the embodiments of the present disclosure or in the related technologies more clearly, the following briefly describes the accompanying drawings required for describing the embodiments or the related technologies. The accompanying drawings in the following description show merely some embodiments of the present disclosure, and a person of ordinary skill in the art may still derive other drawings from these accompanying drawings.

DETAILED EMBODIMENTS OF THE DISCLOSURE

The following clearly and completely describes the technical solutions in the embodiments of the present disclosure with reference to the accompanying drawings in the embodiments of the present disclosure. Apparently, the described embodiments are merely some of the embodiments of the present disclosure rather than all of the embodiments. All other embodiments obtained by a person of ordinary skill in the art based on the embodiments of the present disclosure without creative efforts shall fall within the protection scope of the present disclosure.

At present, some commonly used audio mixing algorithms are as follows:

1) Direct Superimposition

Direct superimposition means that multiple audio data are summed linearly, and this algorithm is the simplest and most direct method for audio mixing. However, when using this method, there may be a voice truncating distortion caused due to overflow. Because generally, voice pulse code modulation (PCM) data are represented within a range of −32768 to 32767, and a sum of multiple audio data may exceed this valid range, and thus causes a distortion to the voices.

2) Linearly Superimpose Audio Data and then Average the Sum

To improve the distortion after liner superimposition, a result of linearly summing the audio data is averaged. That is to say, if there are N audio data are to be mixed, a sum of the N audio data is divided by N, which equals to that each of the audio data is multiplied by a weight 1/N. In this way, the distortion to the voices is effectively improved. However, if during a multi-party voice call, the number of people whose voices are to be mixed is changed, the number N will change, which may cause that the volumes of people's voices during the multi-party voice call are not constant; and meanwhile, if N is large, for a certain voice collected with a low volume, when it is multiplied by the weight, the volume of the voice will be lower.

In view of the foregoing, embodiments of the present disclosure provide a method and apparatus for audio mixing, so as to improve the overflow distortion situation and solve the problem that voices during a multi-party voice call sometimes are loud and sometimes are low.

Figure 1:
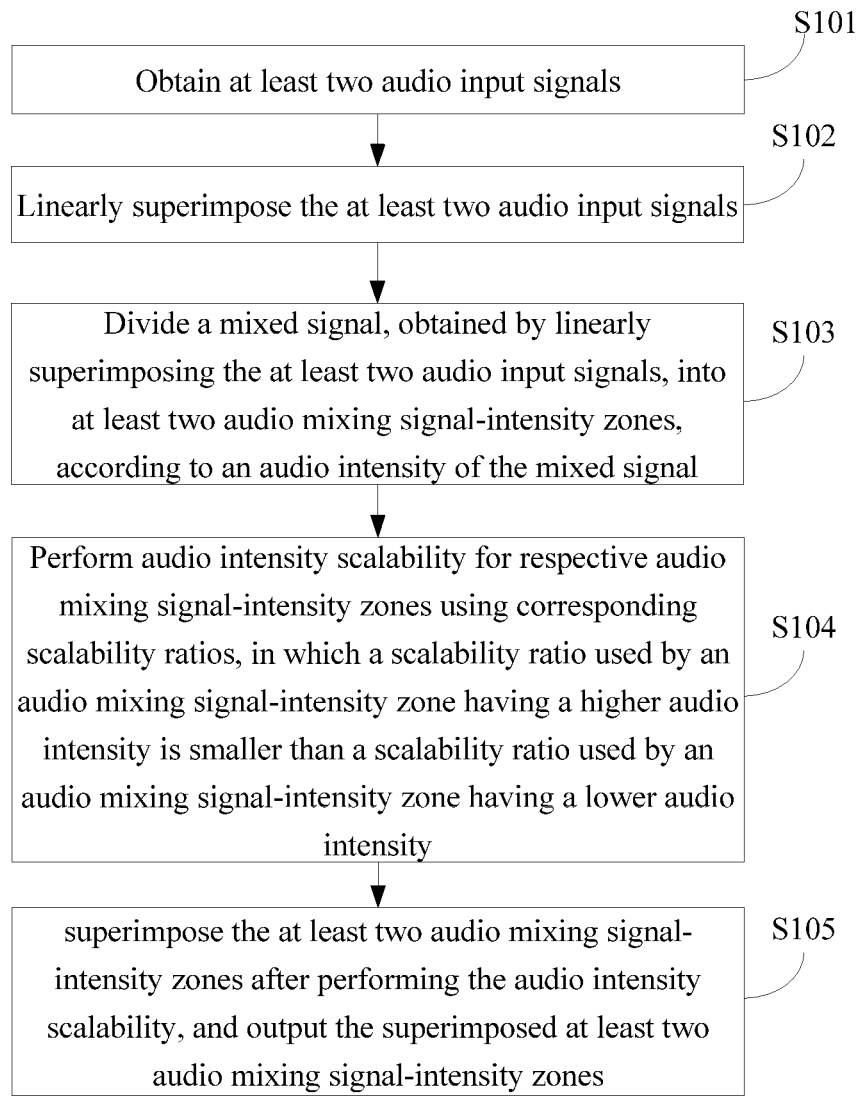
FIG. 1 is a schematic diagram of a flow of a method for audio mixing according to an embodiment of the present disclosure.

FIG. 1 is a schematic diagram of a flow of a method for audio mixing according to an embodiment of the present disclosure, and as shown in FIG. 1, the flow of the method for audio mixing according to the embodiment of the present disclosure may include the following:

S101, at least two audio input signals are obtained.

For example, in a multimedia conference, there are M participants making speeches in the multimedia conference through M terminal devices, and thus there are M audio input signals for audio mixing. In this case, for each participant, it is necessary to send an output signal obtained by mixing the other M−1 audio input signals to him, and meanwhile, it is necessary to output an output signal obtained by mixing all the M audio input signals to the outside. It is to be specified that, the audio input signal mentioned in the embodiments of the present disclosure may be a digital signal processed by sampling, quantification, filtering, and other processing, and may be an analog signal.

S102, the at least two audio input signals are linearly superimposed.

S103, a mixed signal obtained by linearly superimposing the at least two audio input signals is divided into at least two audio mixing signal-intensity zones according to an audio intensity of the mixed signal.

The mixed signal after the linear superimposition is divided into multiple intensity-zone signals, so that the mixed signal in different intensity zones are processed according to different scalabilities. For example, according to a preconfigured dividing threshold, a signal of the mixed signal falling within an intensity zone not larger than the dividing threshold is divided as a first level of intensity-zone signal, a signal of the mixed signal falling within an intensity zone larger than the dividing threshold is divided as a second level of intensity-zone signal, and so on, so that the mixed signal after the linear superimposition is divided into signals in 3 or more intensity zones.

In the embodiment of the present disclosure, according to multiple pre-divided audio intensity distribution zones having an equal length, the signals of the mixed signal that are located in different audio intensity distribution zones are determined as the at least two audio mixing signal-intensity zones. For example, in the multiple pre-divided audio intensity distribution zones having the equal length, the nth audio intensity distribution zone is: $((n-1) \times 2^{Q-1}, n \times 2^{Q-1}]$, where n is a positive integer, $n \geq 1$, Q is a preconfigured constant, and generally Q is a multiple of 2, e.g., 8 or 16.

Then the signals of mixed signal that are located in different audio intensity distribution zones are divided into corresponding audio mixing signal-intensity zones. For example, the audio intensity of the mixing signal after the linear superimposition falls within the first to third audio intensity distribution zones. Then a signal of the mixed signal falling within the first audio intensity distribution zone is determined as the first audio mixing signal-intensity zone, a signal of the mixed signal falling within the second audio intensity distribution zone is determined as the second audio mixing signal-intensity zone, and a signal of the mixed signal falling within the third audio intensity distribution zone is determined as the third audio mixing signal-intensity zone, and similarly in other embodiments.

S104, audio intensity scalability is performed for respective audio mixing signal-intensity zones using corresponding scalability ratios, in which a scalability ratio used by an audio mixing signal-intensity zone having a high audio intensity is smaller than a scalability ratio used by an audio mixing signal-intensity zone having a low audio intensity.

Since a signal having a middle or low intensity in voice signals appears with a probability higher than a probability with which a signal having a high intensity appears, and in the embodiments of the present disclosure, different scalability schemes are used for a signal having a high intensity and a signal having a middle or low intensity. That is to say, the mixed signal after the linear superimposition is scaled by zones, and a signal of the mixed signal having a lower intensity uses a larger scalability ratio, which ensures that the signal having the lower intensity can be scaled to be recognizable, and a signal having a higher intensity uses a smaller scalability ratio, which ensures, as much as possible, that there is no audio signal overflow, and meanwhile ensures that the part of mixed signal can be recognized. The scalability ratio is a ratio of a signal intensity after scalability to an original signal intensity. For example, the original signal intensity is 100, and after the scalability, it becomes 50, and then the scalability ratio is 50%.

As an example, the mixed signal after the linear superimposition is divided into multiple audio mixing signal-intensity zones based on a method of diving an nth audio intensity distribution zone as $((n-1) \times 2^{Q-1}, n \times 2^{Q-1}]$, and a scalability ratio corresponding to an audio mixing signal-intensity zone falling within the nth audio intensity distribution zone is $[(k-1)/k]^* (1/k)^*$, where k is a preconfigured scalability coefficient, and generally it is a multiple of 2, e.g., 8 or 16. In an embodiment of the present disclosure, k is 8, and Q is 16.

S105, the at least two audio mixing signal-intensity zones after the audio intensity scalability is performed are superimposed and output.

The present embodiment uses the foregoing audio mixing method, divides the mixed signal after the linear superimposition into zones according to the audio intensity, and further performs scalability processing using different scalability ratios for different audio mixing signal-intensity zones, so as to avoid the overflow distortion as much as possible, and meanwhile, since when performing the scalability processing for the intensity zones, the scalability ratios are independent of the number of audio data to mix, and the length of time, and thus the problem that the voices sometimes are loud and sometimes are low and unclear is solved.

Figure 2:
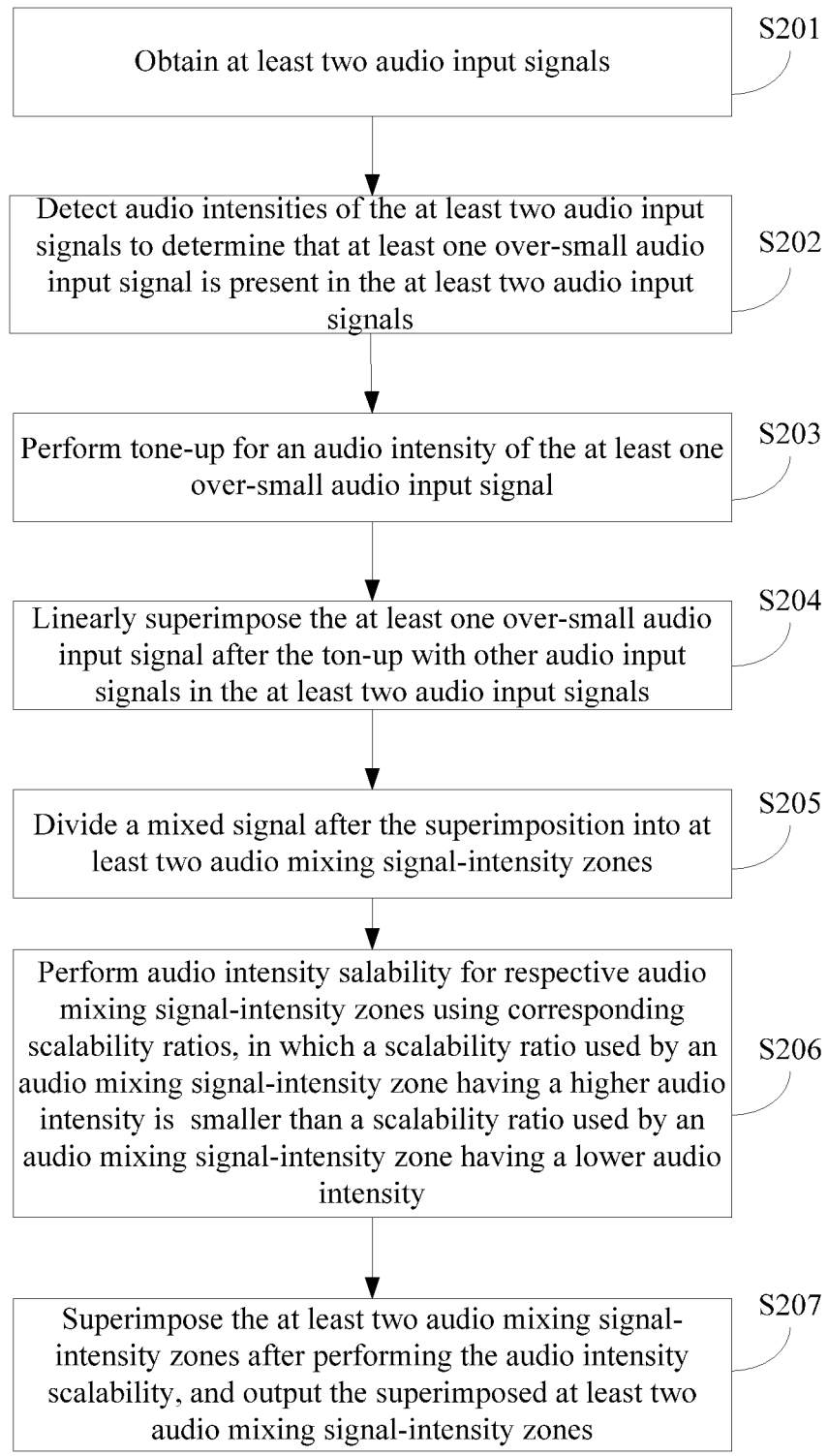
FIG. 2 is a schematic diagram of a flow of a method for audio mixing according to another embodiment of the present disclosure.

FIG. 2 is a schematic diagram of a flow of a method for audio mixing according to another embodiment of the present disclosure. As shown in FIG. 2, the method for audio mixing in the present embodiment may include the following.

S201, at least two audio input signals are obtained.

S202, audio intensities of the at least two audio input signals are detected to determine whether an audio intensity of an audio input signal in the at least two audio signals is too small.

To be specific, the audio intensities of the at least two audio input signals may be sampled, and the audio intensities of the respective audio input signals are determined according to sampling results. For example, audio intensity sampling is performed for a preconfigured time, and the largest value or an average value of the audio intensity sampling, or the largest value or an average value of a valid voice signal is determined as the audio intensity of the audio input signal. If the audio intensity of a certain audio input signal is smaller than an over-small signal threshold, then the audio input signal may be determined as an over-small audio input signal; and if among the at least two audio input signals, a ratio between the signal intensity of an audio input signal and the signal intensity of another audio input signal is smaller than a preconfigured threshold, then the audio input signal that has a smaller audio intensity is determined as an over-small audio input signal. The preconfigured time may be 10 seconds or 5 seconds, and during the audio intensity sampling, first, the respective audio input signals may be linearly superimposed. It is to be specified that, the detection of the over-small audio input signal may be performed when an audio input signal is newly obtained, or may be periodic, for example, every 1 minute or 30 seconds, so as to ensure that tone-up may be performed targeted for an audio input signal having a low volume due to a failure or a channel problem.

In implementation, first an audio input signal having the largest audio intensity in the at least two audio input signals may be determined, and then whether the ratio of the audio intensity of a certain audio input signal to the audio intensity of the audio input signal having the largest audio intensity is smaller than a preconfigured threshold is determined, and if yes, then it is determined that the certain audio input signal is an over-small audio input signal.

In another implementation, the audio intensities of the at least two audio input signals may be obtained by performing sampling of a preconfigured time length, and if there are a first audio input signal and a second audio input signal that meet the following condition, then it is determined that the first audio input signal is an over-small audio input signal: in a same sampling period, the ratio of the largest sampling value of the first audio input signal to the lowest sampling value of a valid audio signal of the second audio input signal is not larger than the preconfigured threshold. For example, if all sampling values of a certain audio input signal are within a range $(0, p* 2^{Q-1}]$, where $p<0.03$, and meanwhile, all sampling values of a valid audio signal of a certain audio input signal are within a range $(2^{Q-1},\infty]$, then it may be determined that the audio input signal that has the smaller sampling values is an over-small audio input signal.

S203, tone-up is performed for the audio intensity of the at least one over-small audio input signal.

To be specific, since with a large probability that an over-small audio input signal may not be clearly heard due to the temporal masking effect, and therefore, in the present embodiment, first tone-up is performed for the audio intensity of the over-small audio input signal detected, and then the over-small audio input signal after the tone-up is linearly superimposed with other audio input signals. A tone-up coefficient may be set on demand. For example, it may be determined according to a ratio between the audio intensity of an over-small audio input signal and the audio intensity of an audio input signal having a normal audio intensity, and may be determined according to the sampling values of the over-small audio input signal. As an example, the tone-up coefficient may be: $2^{Q-1}/MSQ(s)$, where $MSQ(s)$ is the root-mean-square of audio intensity sampling values of the over-small audio signal sampled during a preconfigured length of time.

S204, after the tone-up is performed for the audio intensity of the over-small audio input signal, the over-small audio input signal is linearly superimposed with other audio signals.

S205, a mixed signal obtained by linearly superimposing the at least two audio input signals is divided into at least two audio mixing signal-intensity zones according to an audio intensity of the mixed signal.

In the embodiment of the present disclosure, according to multiple pre-divided audio intensity distribution zones having an equal length, the signals of the mixed signal that are located in different audio intensity distribution zones are determined as the at least two audio mixing signal-intensity zones. For example, in the multiple pre-divided audio intensity distribution zones having the equal length, the nth audio intensity distribution zone is: $((n-1) \times 2^{Q-1}, n \times 2^{Q-1}]$, where n is a positive integer, $n \geq 1$, Q is a preconfigured constant, and generally Q is a multiple of 2, e.g., 8 or 16. Further, the signals of the mixed signal that are located in different audio intensity distribution zones are divided into corresponding audio mixing signal-intensity zones.

S206, audio intensity scalability is performed for respective audio mixing signal-intensity zones using corresponding scalability ratios, in which a scalability ratio used by an audio mixing signal-intensity zone having a high audio intensity is smaller than a scalability ratio used by an audio mixing signal-intensity zone having a low audio intensity.

Since a signal having a middle or low intensity in voice signals appears with a probability higher than a probability with which a signal having a high intensity appears, and in the embodiments of the present disclosure, different scalability schemes are used for a signal having a high intensity and a signal having a middle or low intensity. That is to say, the mixed signal after the linear superimposition is scaled by zones, and a signal of the mixed signal having a lower intensity uses a larger scalability ratio, which ensures that the signal having the lower intensity can be scaled to be recognizable, and a signal having a higher intensity uses a smaller scalability ratio. To be specific, a scalability ratio corresponding to an audio mixing signal-intensity zone falling within the nth audio intensity distribution zone is $[(k-1)/k]*(1/k)^n$, where k is a preconfigured scalability coefficient, and generally it is a multiple of 2, e.g., 8 or 16. In an embodiment, k is 8, and Q is 16.

S207, the at least two audio mixing signal-intensity zones after the audio intensity scalability is performed are superimposed and output.

The present embodiment uses the foregoing audio mixing method, divides the mixed signal after the linear superimposition into zones according to the audio intensity, and further performs scalability processing using different scalability ratios for different audio mixing signal-intensity zones, so as to avoid the overflow distortion as much as possible, and meanwhile, since when performing the scalability processing for the intensity zones, the scalability ratios are independent of the number of audio data to mix, and the length of time, and thus the problem that the voices sometimes are loud and sometimes are low and unclear is solved, and meanwhile, with the detection of the over-small signal and performing the tone-up for the same, the problem that a voice having a small volume may not be clearly heard due to masking is solved.

Figure 3:
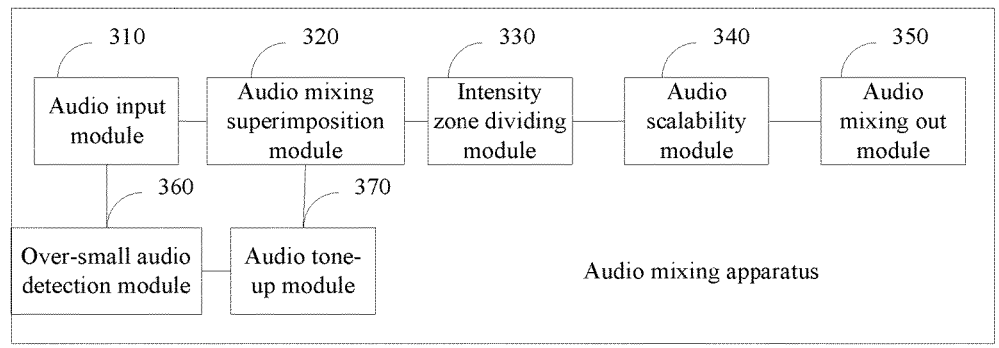
FIG. 3 is a schematic diagram of a structure of an apparatus for audio mixing according to an embodiment of the present disclosure.

FIG. 3 is a schematic diagram of a structure of an apparatus for audio mixing according to an embodiment of the present disclosure. As shown in FIG. 3, the apparatus in the present embodiment may include:

an audio input module 310 to obtain at least two audio input signals.

For example, in a multimedia conference, there are M participants making speeches in the multimedia conference through M terminal devices, and thus there are M audio input signals for audio mixing. In this case, for each participant, it is necessary to send an output signal obtained by mixing the other M−1 audio input signals to him, and meanwhile, it is necessary to output an output signal obtained by mixing all the M audio input signals to the outside. It is to be specified that, the audio input signal mentioned in the embodiments of the present disclosure may be a digital signal processed by sampling, quantification, filtering, and other processing, and may be an analog signal.

An audio mixing superimposition module 320 is configured to linearly superimpose the at least two audio input signals.

An intensity zone division module 330 is configured to divide a mixed signal obtained by linearly superimposing the at least two audio input signals into at least two audio mixing signal-intensity zones according to an audio intensity of the mixed signal.

The mixed signal after the linear superimposition is divided into multiple intensity-zone signals, so that the mixed signal in different intensity zones are processed according to different scalabilities. For example, according to a preconfigured dividing threshold, a signal of the mixed signal falling within an intensity zone not larger than the dividing threshold is divided as a first level of intensity-zone signal, a signal of the mixed signal falling within an intensity zone larger than the dividing threshold is divided as a second level of intensity-zone signal, and so on, so that the mixed signal after the linear superimposition is divided into signals in 3 or more intensity zones.

In the embodiment of the present disclosure, according to multiple pre-divided audio intensity distribution zones having an equal length, the intensity zone division module 330 may determine the signals of the mixed signal that are located in different audio intensity distribution zones as the at least two audio mixing signal-intensity zones. For example, in the multiple pre-divided audio intensity distribution zones having the equal length, the nth audio intensity distribution zone is: $((n-1) \times 2^{Q-1}, n \times 2^{Q-1}]$, where n is a positive integer, $n \geq 1$, Q is a preconfigured constant, and generally Q is a multiple of 2, e.g., 8 or 16.

Thus, the intensity zone division module 330 may divide the signals of the mixed signal that are located in different audio intensity distribution zones into corresponding audio mixing signal-intensity zones. For example, the audio intensity of the mixing signal after the linear superimposition falls within the first to third audio intensity distribution zones. Then a signal of the mixed signal falling within the first audio intensity distribution zone is determined as the first audio mixing signal-intensity zone, a signal of the mixed signal falling within the second audio intensity distribution zone is determined as the second audio mixing signal-intensity zone, and a signal of the mixed signal falling within the third audio intensity distribution zone is determined as the third audio mixing signal-intensity zone, and similarly in other embodiments.

An audio scalability module 340 is configured to perform audio intensity scalability for respective audio mixing signal-intensity zones using corresponding scalability ratios, in which a scalability ratio used by an audio mixing signal-intensity zone having a higher audio intensity is smaller than a scalability ratio used by an audio mixing signal-intensity zone having a lower audio intensity.

Since a signal having a middle or low intensity in voice signals appears with a probability higher than a probability with which a signal having a high intensity appears, and the audio scalability module 340 uses different scalability schemes for a signal having a high intensity and a signal having a middle or low intensity. That is to say, the mixed signal after the linear superimposition is scaled by zones, and a signal of the mixed signal having a lower intensity uses a larger scalability ratio, which ensures that the signal having the lower intensity can be scaled to be recognizable, and a signal having a higher intensity uses a smaller scalability ratio, which ensures, as much as possible, that there is no audio signal overflow, and meanwhile ensures that the part of mixed signal can be recognized. The scalability ratio is a ratio of a signal intensity after scalability to an original signal intensity. For example, the original signal intensity is 100, and after the scalability, it becomes 50, and then the scalability ratio is 50%.

As an example, the mixed signal after the linear superimposition is divided into multiple audio mixing signal-intensity zones based on a method of diving an nth audio intensity distribution zone as $((n-1) \times 2^{Q-1}, n \times 2^{Q-1}]$, and a scalability ratio corresponding to an audio mixing signal-intensity zone falling within the nth audio intensity distribution zone is $[(k-1)/k]*(1/k)$ where k is a preconfigured scalability coefficient, and generally it is a multiple of 2, e.g., 8 or 16. In an embodiment of the present disclosure, k is 8, and Q is 16.

An audio mixing output module 350 is configured to superimpose the at least two audio mixing signal-intensity zones after the audio intensity scalability is performed, and output the superimposed at least two audio mixing signal-intensity zones.

In an embodiment of the present disclosure, the audio mixing apparatus may further include:

an over-small audio detection module 360 to detect audio intensities of the at least two audio input signals to determine that an audio intensity of an audio input signal in the at least two audio signals is too small.

To be specific, the over-small audio detection module 360 may perform sampling for the audio intensities of the at least two audio input signals, and determine the audio intensities of the respective audio input signals according to sampling results. For example, audio intensity sampling is performed for a preconfigured time, and the largest value or an average value of the audio intensity sampling, or the largest value or an average value of a valid voice signal is determined as the audio intensity of the audio input signal. If the audio intensity of a certain audio input signal is smaller than an over-small signal threshold, then the audio input signal may be determined as an over-small audio input signal; and if among the at least two audio input signals, a ratio between the signal intensity of an audio input signal and the signal intensity of another audio input signal is smaller than a preconfigured threshold, then the audio input signal that has a smaller audio intensity is determined as an over-small audio input signal. The preconfigured time may be 10 seconds or 5 seconds, and during the audio intensity sampling, first, the respective audio input signals may be linearly superimposed. It is to be specified that, the detection of the over-small input signal may be performed when an audio input signal is newly obtained, or may be periodic, for example, every 1 minute or 30 seconds, so as to ensure that tone-up may be performed targeted for an audio input signal having a low volume due to a failure or a channel problem.

In implementation, first the over-small audio detection module 360 may first determine an audio input signal having the largest audio intensity in the at least two audio input signals, and then determines whether the ratio of the audio intensity of a certain audio input signal to the audio intensity of the audio input signal having the largest audio intensity is smaller than a preconfigured threshold, and if yes, then it determine that the certain audio input signal is an over-small audio input signal.

In another implementation, the over-small audio detection module 360 may perform sampling of a preconfigured time length for the audio intensities of the at least two audio input signals, and if there are a first audio input signal and a second audio input signal that meet the following condition, then the over-small audio detection module 360 determines that the first audio input signal is an over-small audio input signal: in a same sampling period, the ratio of the largest sampling value of the first audio input signal to the lowest sampling value of a valid audio signal of the second audio input signal is not larger than a preconfigured threshold. For example, if all sampling values of a certain audio input signal are within a range $(0, p* 2^{Q-1}]$, where p<0.03, and meanwhile, all sampling values of a valid audio signal of a certain audio input signal are within a range $(2^{Q-1}, \infty]$, then it may determine that the audio input signal that has the smaller sampling value is an over-small audio input signal.

An audio tone-up module 370 is configured to perform tone-up for the audio intensity the at least one over-small audio input signal.

To be specific, since with a large probability that an over-small audio input signal may not be clearly heard due to the temporal masking effect, and therefore, the audio tone-up module 370 first performs tone-up for the audio intensity of the over-small audio signal detected, and then the audio superimposition module 320 linearly superimposes the over-small audio signal with other audio signals. The tone-up coefficient may be set on demand. For example, it may be determined according to a ratio between the audio intensity of an over-small audio input signal and the audio intensity of an audio input signal having a normal audio intensity, and may be determined according to the sampling values of the over-small audio input signal. As an example, the tone-up coefficient may be: $2^{Q-1}/MSQ(s)$, where MSQ(s) is the root-mean-square of audio intensity sampling values of the over-small audio signal sampled during a preconfigured length of time.

The audio mixing apparatus in the present embodiment divides the mixed signal after the linear superimposition into zones according to the audio intensity, and further performs scalability processing using different scalability ratios for different audio mixing signal-intensity zones, so as to avoid the overflow distortion as much as possible, and meanwhile, since when performing the scalability processing for the intensity zones, the scalability ratios are independent of the number of audio data to mix, and the length of time, and thus the problem that the voices sometimes are loud and sometimes are low and unclear is solved, and meanwhile, with the detection of the over-small signal and performing the tone-up for the same, the problem that a voice having a small volume may not be clearly heard due to masking is solved.

Figure 4:
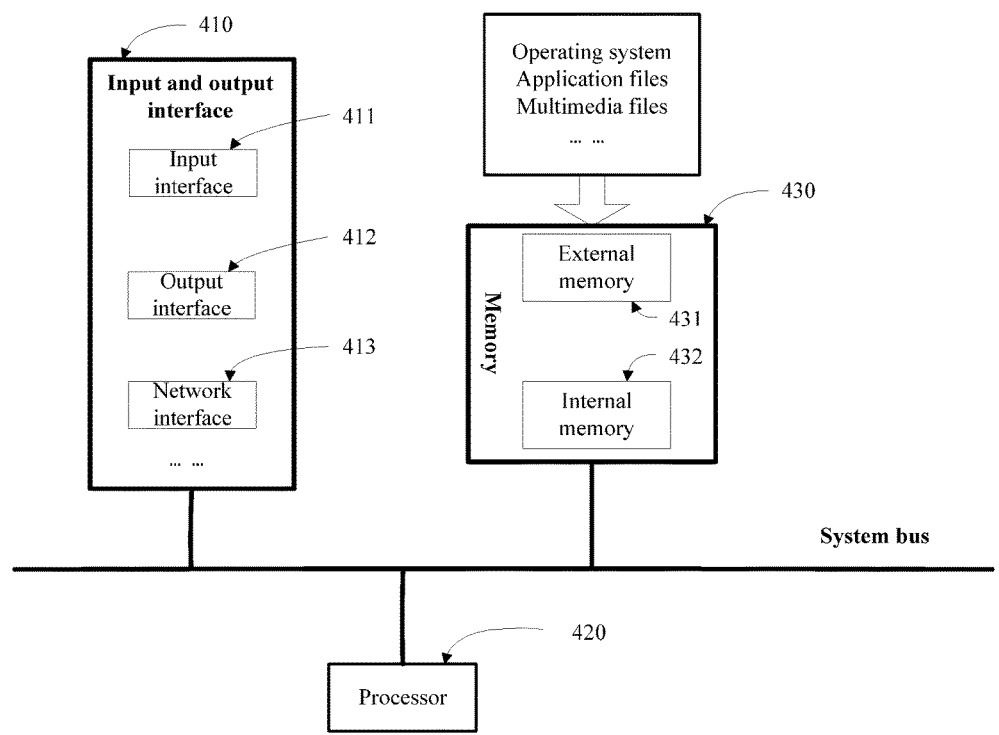
FIG. 4 is a schematic diagram of a structure of an apparatus for audio mixing according to another embodiment of the present disclosure.

FIG. 4 shows a computer system based on Von Neumann computer architecture that performs the above audio mixing methods. The computer system may be a terminal device such as a smart phone, a tablet computer, a handheld computer, a laptop, or a personal computer. Specifically, the computer system may include an input and output interface 410, a processor 420 and a memory 430 connected through a system bus. The input and output interface 410 may include an input interface 411 used to obtain multiple audio input signals, an output interface 412 used to output an audio mixing result, and a network interface 413. The memory 430 may include an external memory 431 (e.g., a hard disk, a compact disk, or a floppy disk) and an internal memory 432.

In the present embodiment, the audio mixing method may be performed based on a computer program, and a program file of the computer program is stored on the external memory 431 of the computer system based on the Von Neumann computer architecture, and it is loaded to the internal memory 432 when it is run, then the program file is compiled to machine codes and transmitted to the processor 420 to execute, so that the computer system based on the Von Neumann computer architecture forms logically the audio input module 310, the audio mixing superimposition module 320, the intensity zone division module 330, the audio scalability module 340, the audio mixing output module 350, the over-small audio detection module 360 and the audio tone-up module 370. In the method, when performing the audio mixing method, inputted parameters are all received through the input interface 411, and then they are transmitted to and stored on the internal memory 432. Then the inputted parameters are inputted to the processor 420 to be processed, a resulting data of the processing may be cached in the internal memory 432 for subsequent processing, or may be transmitted to the output interface 412 or the network interface 413 to be output.

Persons of ordinary skill in the art may understand that some or all of the operations in the method implementations may be implemented by a program instructing relevant hardware. The program may be stored in a non-transitory computer readable storage medium. When the program is executed, the operations in the method implementations are performed. The storage medium may be any medium that is capable of storing program code, such as a portable storage device, a read-only memory (ROM, Read-Only Memory), a random access memory (RAM, Random Access Memory), a magnetic disk, or an optical disk.

The foregoing descriptions are merely embodiments of the present disclosure, but are not intended to limit the protection scope of the present disclosure. Any variation or replacement made within the technical scope disclosed in the present disclosure shall fall within the protection scope of the present disclosure.

What is claimed is:

1. A method for audio mixing, comprising:
obtaining at least two audio input signals;
linearly superimposing the at least two audio input signals;
dividing a mixed signal, obtained by linearly superimposing the at least two audio input signals, into at least two audio mixing signal-intensity zones according to an audio intensity of the mixed signal;
performing audio intensity scalability for respective audio mixing signal-intensity zones using corresponding scalability ratios, wherein a scalability ratio used by an audio mixing signal-intensity zone having a higher audio intensity is smaller than a scalability ratio used by an audio mixing signal-intensity zone having a lower audio intensity; and
superimposing the at least two audio mixing signal-intensity zones after performing the audio intensity scalability, and outputting the superimposed at least two audio mixing signal-intensity zones;
wherein, dividing the mixed signal obtained by linearly superimposing the at least two audio input signals into the at least two audio mixing signal-intensity zones according to the audio intensity of the mixed signal comprises:
according to multiple pre-divided audio intensity distribution zones having an equal length, determining signals of the mixed signal that are located in different audio intensity distribution zones as the at least two audio mixing signal-intensity zones, wherein in the multiple pre-divided audio intensity distribution zones having the equal length, an nth audio intensity distribution zone is:
$((n-1) \times 2^{Q-1}, n \times 2^{Q-1}]$, where n is a positive integer, $n \geq 1$, and Q is a preconfigured constant.

2. The method of claim 1, wherein, performing the audio intensity scalability for the respective audio mixing signal-intensity zones using the corresponding scalability ratios comprises:
using a scalability ratio $[(k-1)/k]*(1/k)^n$ corresponding to an audio mixing signal-intensity zone located in the nth audio intensity distribution zone, where k is a preconfigured scalability coefficient.

3. The method of claim 1, wherein the method comprises:
detecting audio intensities of the at least two audio input signals to determine that at least one over-small audio input signal is present in the at least two audio input signals;
performing tone-up for an audio intensity of the at least one over-small audio input signal; and
linearly superimposing the at least two audio input signals comprises:
linearly superimposing the at least one over-small audio input signal after the tone-up with other audio input signals in the at least two audio input signals.

4. The method of claim 3, wherein detecting the audio intensities of the at least two audio input signals to determine that the at least one over-small audio input signal is present in the at least two audio input signals comprises:
determining an audio input signal having the highest audio intensity out of the at least two audio input signals;
in response to that a ratio of an audio intensity of an audio input signal out of the at least two audio input signals to an audio intensity of the audio input signal having the highest audio intensity is smaller than a preconfigured threshold, then determining that the audio input signal is the over-small audio input signal.

5. The method of claim 3, wherein the at least two audio input signals comprise a first audio input signal and a second audio input signal; and
detecting the audio intensities of the at least two audio input signals comprises:
performing sampling of a preconfigured length of time for the audio intensities of the at least two audio input signals; and
in response to that a ratio of a highest sampling value of the first audio input signal to a lowest sampling value of a valid audio signal of the second audio input signal is not larger than a preconfigured threshold, then determining that the first audio input signal is the over-small audio input signal.

6. The method of claim 3, wherein performing the tone-up for the audio intensity of the at least one over-small audio input signal comprises:
performing the tone-up for the audio intensity of the at least one over-small audio input signal according to a gain coefficient $2^{Q-1}/MSQ(s)$, where Q is a preconfigured constant, and MSQ(s) is a root-mean-square of an audio intensity sampling value of the over-small audio input signal.

7. An apparatus for audio mixing, comprising: a processor and a memory, wherein the memory stores instruction modules executable by the processor, and the instruction modules comprise:
an audio input module to obtain at least two audio input signals;
an audio mixing superimposition module to linearly superimpose the at least two audio input signals;
an intensity zone dividing module to divide a mixed signal, obtained by linearly superimposing the at least two audio input signals, into at least two audio mixing signal-intensity zones, according to an audio intensity of the mixed signal;
an audio scalability module to perform audio intensity scalability for respective audio mixing signal-intensity zones using corresponding scalability ratios, wherein a scalability ratio used by an audio mixing signal-intensity zone having a higher audio intensity is smaller than a scalability ratio used by an audio mixing signal-intensity zone having a lower audio intensity; and
an audio mixing output module to superimpose the at least two audio mixing signal-intensity zones after performing the audio intensity scalability, and output the superimposed at least two audio mixing signal-intensity zones;
wherein the intensity zone dividing module is to:
according to multiple pre-divided audio intensity distribution zones having an equal length, determine signals of the mixed signal that are located in different audio intensity distribution zones as the at least two audio mixing signal-intensity zones, wherein in the multiple pre-divided audio intensity distribution zones having the equal length, an nth audio intensity distribution zone is: $((n-1) \times 2^{Q-1}, n \times 2^{Q-1}]$, where n is a positive integer, $n \leq 1$, and Q is a preconfigured constant.

8. The apparatus for audio mixing of claim 7, wherein the audio scalability module performing the audio intensity scalability for the respective audio mixing signal-intensity zones using the corresponding scalability ratios comprises:

using a scalability ratio $[(k-1)/k]*(1/k)^n$ corresponding to an audio mixing signal-intensity zone located in the nth audio intensity distribution zone, where k is a preconfigured scalability coefficient.

9. The apparatus of audio mixing of claim 7, wherein the method further comprises:
    an over-small audio detection module to detect audio intensities of the at least two audio input signals to determine that at least one over-small audio input signal is present in the at least two audio input signals;
    an audio tone-up module to perform tone-up for an audio intensity of the at least one over-small audio input signal; and
    the audio mixing superimposition module is configured to:
    linearly superimposing the at least one over-small audio input signal after the tone-up with other audio input signals in the at least two audio input signals.

10. The apparatus for audio mixing of claim 9, wherein the over-small audio detection module is configured to:
    determine an audio input signal having the highest audio intensity out of the at least two audio input signals;
    in response to that a ratio of an audio intensity of an audio input signal out of the at least two audio input signals to an audio intensity of the audio input signal having the highest audio intensity is smaller than a preconfigured threshold, then determine that the audio input signal is the over-small audio input signal.

11. The apparatus for audio mixing of claim 9, wherein the at least two audio input signals comprise a first audio input signal and a second audio input signal; and
    the over-small audio detection module is configured to:
    perform sampling of a preconfigured length of time for the audio intensities of the at least two audio input signals; and
    in response to that a ratio of a highest sampling value of the first audio input signal to a lowest sampling value of a valid audio signal of the second audio input signal is not larger than a preconfigured threshold, then determine that the first audio input signal is the over-small audio input signal.

12. The apparatus for audio mixing of claim 9, wherein, the audio tone-up module is configured to:
    perform the tone-up for the audio intensity of the at least one over-small audio input signal according to a gain coefficient $2^{Q-1}/MSQ(s)$, where Q is a preconfigured constant, and MSQ(s) is a root-mean-square of an audio intensity sampling value of the over-small audio input signal.

13. A non-transitory storage medium, storing computer instructions, wherein the computer instructions are executable by the processor to perform:
    obtaining at least two audio input signals;
    linearly superimposing the at least two audio input signals;
    dividing a mixed signal, obtained by linearly superimposing the at least two audio input signals, into at least two audio mixing signal-intensity zones according to an audio intensity of the mixed signal;
    performing audio intensity scalability for respective audio mixing signal-intensity zones using corresponding scalability ratios, wherein a scalability ratio used by an audio mixing signal-intensity zone having a higher audio intensity is smaller than a scalability ratio used by an audio mixing signal-intensity zone having a lower audio intensity; and
    superimposing the at least two audio mixing signal-intensity zones after performing the audio intensity scalability, and outputting the superimposed at least two audio mixing signal-intensity zones;
    wherein, dividing the mixed signal obtained by linearly superimposing the at least two audio input signals into the at least two audio mixing signal-intensity zones according to the audio intensity of the mixed signal comprises:
    according to multiple pre-divided audio intensity distribution zones having an equal length, determining signals of the mixed signal that are located in different audio intensity distribution zones as the at least two audio mixing signal-intensity zones, wherein in the multiple pre-divided audio intensity distribution zones having the equal length, an nth audio intensity distribution zone is:
    $((n-1) \times 2^{Q-1}, n \times 2^{Q-1}]$, where n is a positive integer, $n \geq 1$, and Q is a preconfigured constant.

14. The non-transitory storage medium of claim 13, wherein dividing the mixed signal obtained by linearly superimposing the at least two audio input signals into the at least two audio mixing signal-intensity zones according to the audio intensity of the mixed signal comprises:
    according to multiple pre-divided audio intensity distribution zones having an equal length, determining signals of the mixed signal that are located in different audio intensity distribution zones as the at least two audio mixing signal-intensity zones.

15. The non-transitory storage medium of claim 13, wherein the computer instructions are executable by the processor further to perform:
    detecting audio intensities of the at least two audio input signals to determine that at least one over-small audio input signal is present in the at least two audio input signals;
    performing tone-up for an audio intensity of the at least one over-small audio input signal; and
    linearly superimposing the at least two audio input signals comprises:
    linearly superimposing the at least one over-small audio input signal after the tone-up with other audio input signals in the at least two audio input signals.

16. The non-transitory storage medium of claim 15, wherein detecting the audio intensities of the at least two audio input signals to determine that the at least one over-small audio input signal is present in the at least two audio input signals comprises:
    determining an audio input signal having the highest audio intensity out of the at least two audio input signals;
    in response to that a ratio of an audio intensity of an audio input signal out of the at least two audio input signals to an audio intensity of the audio input signal having the highest audio intensity is smaller than a preconfigured threshold, then determining that the audio input signal is the over-small audio input signal.

* * * * *